United States Patent
Yim et al.

(10) Patent No.: US 11,367,688 B2
(45) Date of Patent: Jun. 21, 2022

(54) SEMICONDUCTOR PACKAGE WITH INTERPOSER

(71) Applicant: SAMSUNG ELECTRONICS CO., LTD., Suwon-si (KR)

(72) Inventors: Choongbin Yim, Seoul (KR); Jungwoo Kim, Osan-si (KR); Jihwang Kim, Cheonan-si (KR); Jongbo Shim, Asan-si (KR); Kyoungsei Choi, Yongin-si (KR)

(73) Assignee: SAMSUNG ELECTRONICS CO., LTD.

( * ) Notice: Subject to any disclaimer, the term of this patent is extended or adjusted under 35 U.S.C. 154(b) by 0 days.

(21) Appl. No.: 17/090,502

(22) Filed: Nov. 5, 2020

(65) Prior Publication Data
US 2021/0183777 A1  Jun. 17, 2021

(30) Foreign Application Priority Data

Dec. 11, 2019 (KR) .................. 10-2019-0164801

(51) Int. Cl.
*H01L 23/538* (2006.01)
*H01L 23/31* (2006.01)
*H01L 23/14* (2006.01)

(52) U.S. Cl.
CPC .......... *H01L 23/5384* (2013.01); *H01L 23/14* (2013.01); *H01L 23/31* (2013.01); *H01L 23/5385* (2013.01); *H01L 23/5386* (2013.01)

(58) Field of Classification Search
CPC ..... H01L 23/5384; H01L 23/14; H01L 23/31; H01L 23/5385; H01L 23/5386
USPC ......................................................... 257/774
See application file for complete search history.

(56) References Cited

U.S. PATENT DOCUMENTS

| | | |
|---|---|---|
| 7,262,080 B2 | 8/2007 | Go et al. |
| 7,556,983 B2 | 7/2009 | Kurita |
| 8,928,132 B2 | 1/2015 | Choi et al. |
| 9,502,392 B2 | 11/2016 | Kim et al. |
| 10,090,230 B2 | 10/2018 | Kim et al. |
| 10,177,161 B2 | 1/2019 | Singh et al. |
| 2013/0178016 A1 | 7/2013 | Yim et al. |
| 2014/0131858 A1* | 5/2014 | Pan ................... H01L 24/19 257/737 |
| 2018/0145006 A1 | 5/2018 | Na et al. |
| 2018/0218985 A1 | 8/2018 | Tsai et al. |
| 2019/0103362 A1* | 4/2019 | Lin ................. H01L 23/3114 |
| 2019/0103385 A1 | 4/2019 | Karhade et al. |

* cited by examiner

*Primary Examiner* — Quoc D Hoang
(74) *Attorney, Agent, or Firm* — Myers Bigel, P.A.

(57) ABSTRACT

A semiconductor package includes a first package substrate, a first semiconductor chip on the first package substrate, a molding layer covering side walls of the first semiconductor chip and including through holes, an interposer on the first semiconductor chip and the molding layer, conductive connectors in the through holes of the molding layer and connected to the first package substrate and the interposer, and an insulating filler including a first portion that fills the through holes of the molding layer so as to surround side walls of the conductive connectors.

20 Claims, 15 Drawing Sheets

SEMICONDUCTOR PACKAGE WITH INTERPOSER

CROSS-REFERENCE TO RELATED APPLICATION

This application claims the benefit of Korean Patent Application No. 10-2019-0164801, filed on Dec. 11, 2019, in the Korean Intellectual Property Office, the disclosure of which is incorporated herein in its entirety by reference.

BACKGROUND

The inventive concept relates to a semiconductor package, and more particularly, to a semiconductor package including an interposer.

With the remarkable development of the electronics industry to satisfy users' demand for various electronic devices, electronic devices are becoming more miniaturized, multifunctional, and capable of having larger capacities. Therefore, a semiconductor package including a plurality of semiconductor chips is required. As the plurality of semiconductor chips in the semiconductor package are highly integrated, a printed circuit board (PCB) often fails to support such a high degree of integration. In order to solve this problem, a semiconductor package in which a plurality of semiconductor chips are connected by using an interposer has been proposed.

SUMMARY

The inventive concept relates to a semiconductor package including interposers.

According to an aspect of the inventive concept, a semiconductor package includes a first package substrate, a first semiconductor chip on the first package substrate, a molding layer covering side walls of the first semiconductor chip and including through holes, an interposer on the first semiconductor chip and the molding layer, conductive connectors in the through holes of the molding layer and connected to the first package substrate and the interposer, and an insulating filler including a first portion that fills the through holes of the molding layer so as to surround side walls of the conductive connectors.

According to an aspect of the inventive concept, a semiconductor package includes a package substrate, a semiconductor chip on the package substrate, a molding layer covering side walls of the semiconductor chip and including first trenches, an interposer on the semiconductor chip and the molding layer, the interposer including an interposer substrate and first protrusions protruding from a lower surface of the interposer substrate and extending into the first trenches of the molding layer, and conductive connectors penetrating through the molding layer and connected to the package substrate and the interposer.

According to an aspect of the inventive concept, a semiconductor package includes a first package including a first package substrate, a first semiconductor chip on the first package substrate, and a molding layer configured to cover side walls of the first semiconductor chip, an interposer on the first package, conductive connectors in through holes of the molding layer and electrically connecting the interposer to the first package substrate, an insulating filler filling a gap between the interposer and the first package substrate and filling the through holes of the molding layer so as to surround side walls of the conductive connectors, and a second package on the interposer and including a second package substrate and a second semiconductor chip on the second package substrate. An upper surface of the molding layer is coplanar with an upper surface of the first semiconductor chip.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
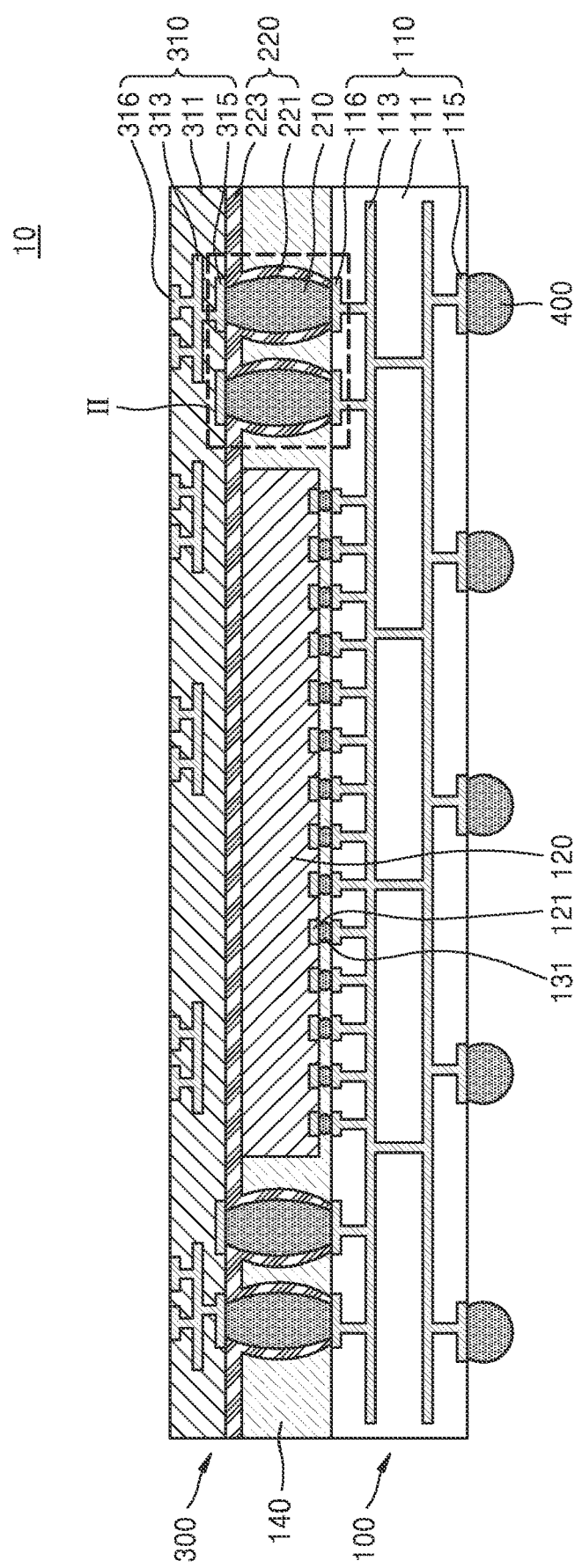
FIG. 1 is a cross-sectional view illustrating a semiconductor package according to example embodiments of the inventive concept.

Hereinafter, embodiments of the inventive concept will be described in detail with reference to the accompanying drawings. Like reference numerals refer to like elements throughout and previously given description will be omitted.

Figure 2:
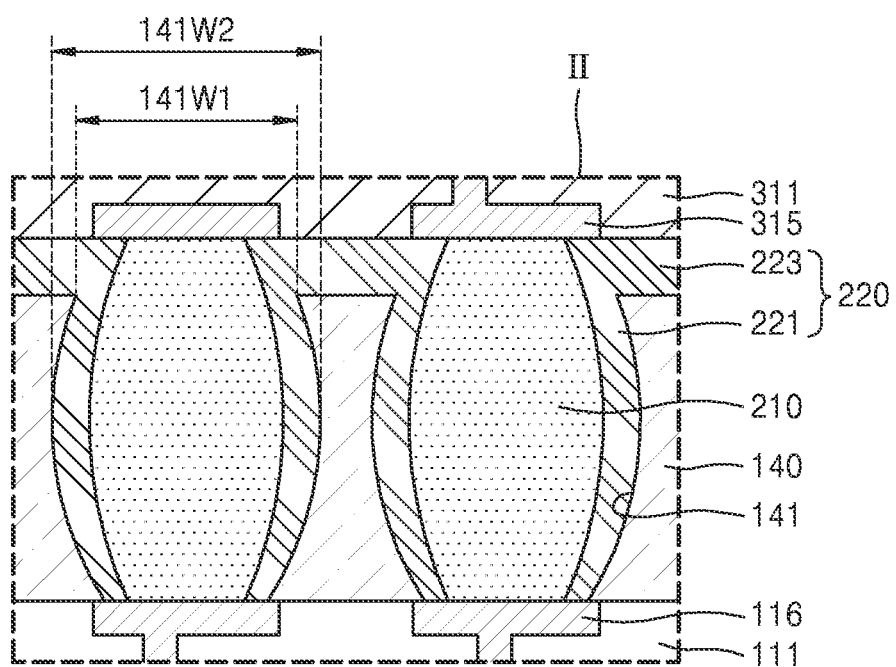
FIG. 2 is an enlarged view of a portion marked with "E" in FIG. 1.

FIG. 1 is a cross-sectional view illustrating a semiconductor package 10 according to example embodiments of the inventive concept. FIG. 2 is an enlarged view of a portion marked with "II" in FIG. 1.

Referring to FIGS. 1 and 2, the semiconductor package 10 may include a first package 100, an interposer 300 provided on the first package 100, conductive connectors 210 electrically connecting the first package 100 to the interposer 300, and an insulating filler 220 filled between the first package 100 and the interposer 300.

The first package 100 may include a first package substrate 110, a first semiconductor chip 120, and a first molding layer 140. The first package 100 may be, for example, a flip chip package in which the first semiconductor chip 120 is mounted on the first package substrate 110 by a face-down manner. In this case, chip connection terminals 131 are arranged between the first chip pad 121 of the first semiconductor chip 120 and upper pads 116 of the first package substrate 110, and the chip connection terminals 131 may electrically/physically connect the first chip pads 121 of the first semiconductor chip 120 to the upper pads 116 of the first package substrate 110.

The first package substrate 110 may be, for example, a printed circuit board (PCB). The first package substrate 110 may include a substrate base 111 including at least one selected from phenol resin, epoxy resin, and polyimide. In addition, the first package substrate 110 may include the upper pads 116 formed on an upper surface of the substrate base 111 and lower pads 115 formed on a lower surface of the substrate base 111. In the substrate base 111, an internal wiring line 113 for electrically connecting the upper pads 116 to the lower pads 115 may be formed.

The upper pads 116 and the lower pads 115 may include, for example, a metal such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), or ruthenium (Ru) or an alloy of the above metals. However, the inventive concept is not limited thereto.

The conductive connectors 210 or the chip connection terminals 131 may be attached to upper pads 116. In addition, external connection terminals 400 may be attached to the lower pads 115. The external connection terminals 400 may be, for example, solder balls or bumps. The external connection terminals 400 may electrically connect the semiconductor package 10 to an external device.

The first semiconductor chip 120 may be mounted on the first package substrate 110. The first semiconductor chip 120 includes a semiconductor substrate having an active surface and an inactive surface opposite to each other and may include a semiconductor device layer formed on the active surface of the semiconductor substrate. The first semiconductor chip 120 includes a lower surface and an upper surface opposite to each other. The first chip pads 121 may be provided on the lower surface of the first semiconductor chip 120. The first chip pads 121 of the first semiconductor chip 120 may be electrically connected to the semiconductor device layer through a wiring structure (not shown).

The first semiconductor chip 120 may include a volatile memory chip and/or a non-volatile memory chip as a memory chip. The volatile memory chip may be, for example, dynamic random access memory (DRAM), static RAM (SRAM), thyristor RAM (TRAM), zero capacitor RAM (ZRAM), or twin transistor RAM (TTRAM). In addition, the non-volatile memory chip may be, for example, flash memory, magnetic RAM (MRAM), spin-transfer torque MRAM (STT-MRAM), ferroelectric RAM (FRAM), phase change RAM (PRAM), resistive RAM (RRAM), nanotube RRAM, polymer RAM, or insulator resistance change memory.

The first semiconductor chip 120 may be a non-memory chip. For example, the first semiconductor chip 120 as a logic chip may be implemented by an artificial intelligence (AI) semiconductor, a microprocessor, a graphic processor, a signal processor, a network processor, a chipset, an audio codec, a video codec, an application processor, or a system on chip (SoC). However, the inventive concept is not limited thereto.

The first semiconductor chip 120 may be mounted on the first package substrate 110 so that one surface of the first semiconductor chip 120 on which the first chip pads 121 are provided faces the first package substrate 110. The first chip pads 121 of the first semiconductor chip 120 may be used as terminals for transmitting input/output data signals of the first semiconductor chip 120 or terminals for power and/or ground of the first semiconductor chip 120.

The first molding layer 140 is provided on the first package substrate 110 and may cover at least a part of the first semiconductor chip 120. The first molding layer 140 may protect the first semiconductor chip 120 against an external environment. In addition, the first molding layer 140 may include an under-fill portion that fills a gap between the first semiconductor chip 120 and the first package substrate 110 and surrounds the chip connection terminals 131 interposed between the first semiconductor chip 120 and the first package substrate 110.

The first molding layer 140 may be formed by injecting a proper amount of molding material into the periphery of the first semiconductor chip 120 by an injecting process and hardening the molding material through a hardening process. In some embodiments, a molding material for forming the first molding layer 140 may include epoxy-group molding resin or polyimide-group molding resin. For example, the first molding layer 140 may include epoxy molding compound (EMC).

In example embodiments, the first molding layer 140 may cover side walls of the first semiconductor chip 120 and may not cover the upper surface of the first semiconductor chip 120.

In example embodiments, an upper surface of the first molding layer 140 and the upper surface of the first semiconductor chip 120 may be planarized (or flattened) surfaces. The upper surface of the first molding layer 140 may be coplanar with the upper surface of the first semiconductor chip 120.

The interposer 300 may be arranged on the first semiconductor chip 120 and the first molding layer 140. The interposer 300 may include an interposer substrate 310. The interposer substrate 310 may include an interposer substrate base 311 formed of at least one material selected from phenol resin, epoxy resin, and polyimide. The interposer substrate 310 may include interposer upper pads 316 and interposer lower pads 315 respectively formed on an upper surface of the interposer substrate base 311 and a lower surface of the interposer substrate base 311. Interposer internal wiring lines 313 for electrically connecting the interposer upper pads 316 to the interposer lower pads 315 may be formed in the interposer substrate base 311.

The interposer upper pads 316 and the interposer lower pads 315 may be formed of, for example, a metal such as Cu, Al, W, Ti, Ta, In, Mo, Mn, Co, Sn, Ni, Mg, Re, Be, Ga, or Ru or an alloy of the above metals. However, the inventive concept is not limited thereto.

The conductive connectors 210 may be spaced apart from the side walls of the first semiconductor chip 120 in a horizontal direction. The conductive connectors 210 may be accommodated in through holes 141 of the first molding layer 140. The conductive connectors 210 may extend in a vertical direction, for example, a direction perpendicular to an upper surface of the first package substrate 110. Each of the conductive connectors 210 may have a pillar (or column) shape. Parts of the conductive connectors 210 may protrude from the upper surface of the first molding layer 140 and upper ends of the conductive connectors 210 may be positioned at a level higher than that of the upper surface of the first molding layer 140.

Lower ends of the conductive connectors 210 may be connected to the upper pads 116 of the first package substrate 110 and the upper ends of the conductive connectors 210 may be connected to the interposer lower pads 315 on a lower surface of the interposer substrate 310. The conductive connectors 210 may electrically connect the upper pads 116 of the first package substrate 110 to the interposer lower pads 315 of the interposer substrate 310.

For example, the conductive connectors 210 may include at least one selected from solder, Al, Cu, Ni, W, platinum (Pt), and gold (Au).

The insulating filler 220 may include a first portion 221 that fills the through holes 141 of the first molding layer 140. The first portion 221 of the insulating filler 220 may fill a gap between side walls of the conductive connectors 210 and an inner wall of the first molding layer 140 provided by the through holes 141 of the first molding layer 140. The side walls of the conductive connectors 210 may be surrounded by the first portion 221 of the insulating filler 220. The side walls of the conductive connectors 210 and the inner wall of the first molding layer 140 may be spaced apart from each other with the first portion 221 of the insulating filler 220 interposed therebetween.

The insulating filler 220 may at least partially fill the gap between the side walls of the conductive connectors 210 and the inner wall of the first molding layer 140. That is, the insulating filler 220 may entirely fill the gap between the side walls of the conductive connectors 210 and the inner wall of the first molding layer 140 and may partially fill the gap between the side walls of the conductive connectors 210 and the inner wall of the first molding layer 140.

In addition, the insulating filler 220 may include a second portion 223 that fills a gap between the first package 100 and the interposer 300. In more detail, the second portion 223 of the insulating filter 220 may fill a gap between the lower surface of the interposer substrate 310 and the upper surface of the first molding layer 140 and may fill a gap between the lower surface of the interposer substrate 310 and the upper surface of the first semiconductor chip 120.

In example embodiments, the insulating filler 220 may be formed of under-fill resin formed by a capillary under-fill method. Alternatively, in example embodiments, the insulating filler 220 may be a non-conductive film. In example embodiments, the insulating filler 220 may include a material different from that of the first molding layer 140.

In example embodiments, since the gap between the conductive connectors 210 and the inner wall of the first molding layer 140 is filled with the insulating filler 220, the conductive connectors 210 may be protected. In addition, since the gap between the first package 100 and the interposer 300 is filled with the insulating filler 220, the interposer 300 may be firmly attached onto the first package 100.

In example embodiments, as illustrated in FIG. 2, a horizontal width of each of the through holes 141 of the first molding layer 140 may be greatest. That is, a width 141W1 of an upper end of each of the through holes 141 of the first molding layer 140 may be less than a width 141W2 of an intermediate portion of each of the through holes 141 of the first molding layer 140.

In example embodiments, in a first direction from a lower surface of the first molding layer 140 toward the upper surface thereof, a width of a lower portion of each of the through holes 141 of the first molding layer 140 increases along the first direction and a width of an upper portion of each of the through holes 141 of the first molding layer 140 is reduced along the first direction, as illustrated.

In addition, in example embodiments, a horizontal width of the center of each of the conductive connectors 210 is greatest like in the shape of each of the through holes 141 of the first molding layer 140. That is, a width of a lower portion of each of the conductive connectors 210 increases along the first direction and a width of an upper portion of each of the conductive connectors 210 is reduced along the first direction, as illustrated.

Figure 3:
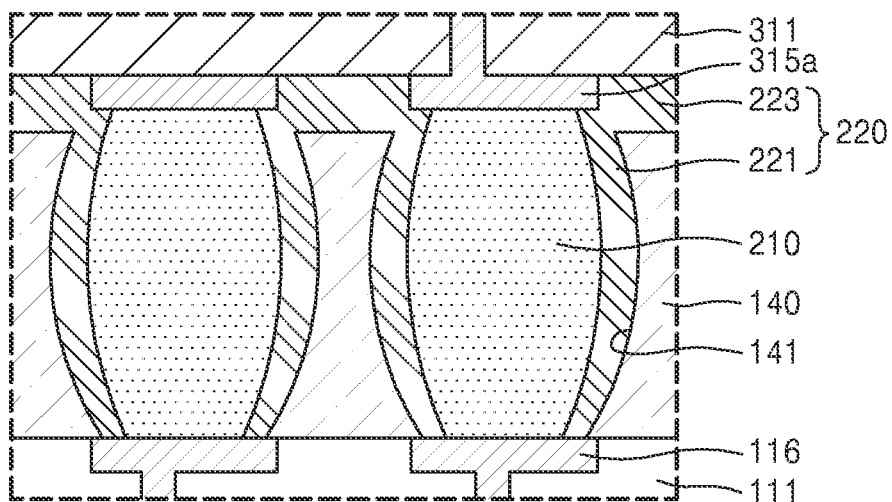
FIG. 3 is a cross-sectional view illustrating a part of a semiconductor package according to example embodiments of the inventive concept.

FIG. 3 is a cross-sectional view illustrating a part of a semiconductor package according to example embodiments of the inventive concept. FIG. 3 illustrates a portion corresponding to an area marked with "II" of FIG. 1. The semiconductor package illustrated in FIG. 3 may be the same as or similar to the semiconductor package 10 described with reference to FIGS. 1 and 2 excluding interposer lower pads 315a. Hereinafter, for convenience sake, a difference between the semiconductor package illustrated in FIG. 3 and the semiconductor package 10 described with reference to FIGS. 1 and 2 will be mainly described.

Referring to FIG. 3, the interposer (refer to 300 of FIG. 1) may include the interposer lower pads 315a provided on the lower surface of the interposer substrate 310 to be connected to the conductive connectors 210. At least parts of the interposer lower pads 315a may protrude from the lower surface of the interposer substrate 310. The interposer lower pads 315a may entirely protrude from the lower surface of the interposer substrate 310 and may partially protrude from the lower surface of the interposer substrate 310.

As the interposer lower pads 315a protrude from the interposer substrate base 311, side walls of the interposer lower pads 315a may be covered with the insulating filler 220.

Since the interposer lower pads 315a protrude from the lower surface of the interposer substrate 310, when the conductive connectors 210 are formed by a reflow process, a material that forms the conductive connectors 210 may be more easily attached to the interposer lower pads 315a.

Figure 4:
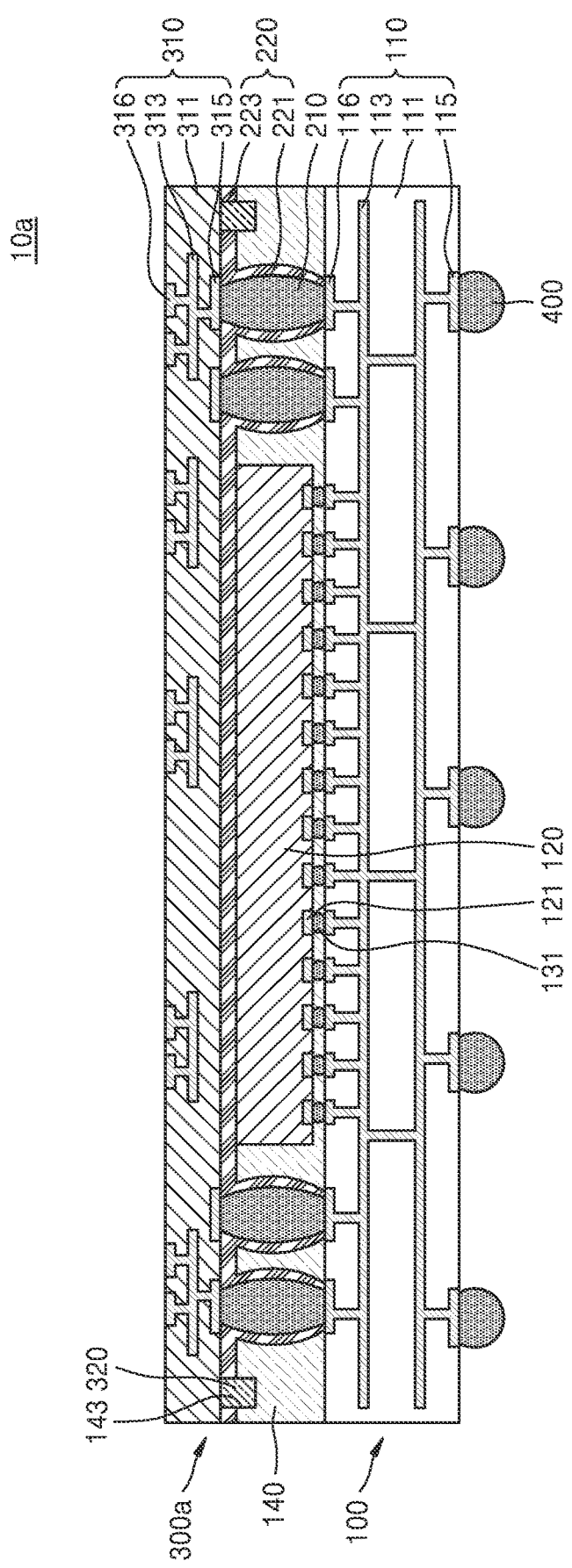
FIG. 4 is a cross-sectional view illustrating a semiconductor package according to example embodiments of the inventive concept.

FIG. 4 is a cross-sectional view illustrating a semiconductor package 10a according to example embodiments of the inventive concept. The semiconductor package 10a illustrated in FIG. 4 may be the same as or similar to the semiconductor package 10 described with reference to FIGS. 1 and 2 excluding that an interposer 300a further includes first protrusions 320. Hereinafter, for convenience sake, a difference between the semiconductor package 10a illustrated in FIG. 4 and the semiconductor package 10 described with reference to FIGS. 1 and 2 will be mainly described.

Referring to FIG. 4, the semiconductor package 10a includes the first package 100, the interposer 300a, the conductive connectors 210, and the insulating filler 220 and the first package 100 may include the first package substrate 110, the first semiconductor chip 120, and the first molding layer 140.

The first molding layer 140 may include first trenches 143 provided in an upper side toward the interposer 300a and the interposer 300a may include the first protrusions 320 inserted into the first trenches 143 of the first molding layer 140. For example, the first protrusions 320 of the interposer 300a may be columnar to protrude from the lower surface of the interposer substrate 310 and each of the first trenches 143 of the first molding layer 140 may have a shape corresponding to that of each of the first protrusions 320 to accommodate each of the first protrusions 320.

In example embodiments, the first molding layer 140 may include a plurality of first trenches 143 and the interposer 300a may include a plurality of first protrusions 320 inserted into the plurality of first trenches 143. For example, the plurality of first trenches 143 may be arranged along an edge of the first molding layer 140 in the outer area of the first molding layer 140 and the plurality of first protrusions 320 may be arranged to correspond to the arrangement of the plurality of first trenches 143.

As the first protrusions 320 of the interposer 300a are inserted into the first trenches 143 of the first molding layer 140, the interposer 300a may be firmly fixed onto the first package 100. In addition, since the interposer 300a and the first package 100 are aligned when the first protrusions 320 of the interposer 300a are inserted into the first trenches 143 of the first molding layer 140, when the interposer 300a is assembled with the first package 100, misalignment between the interposer 300a and the first package 100 may be prevented.

In example embodiments, the first protrusions 320 of the interposer 300a may support the interposer substrate 310 so that the interposer substrate 310 is spaced apart from the upper surface of the first molding layer 140 and the upper surface of the first semiconductor chip 120 by a uniform distance. For example, the interposer substrate 310 may be spaced apart from the upper surface of the first molding layer 140 and the upper surface of the first semiconductor chip 120 by a distance between about 10 μm to about 500 μm.

In more detail, a height of each of the first protrusions 320 of the interposer 300a may be greater than a depth of each of the first trenches 143 of the first molding layer 140. In this case, only parts of the first protrusions 320 may be inserted into the first trenches 143 and the other parts of the first protrusions 320 may be positioned above the upper surface of the first molding layer 140 and may be surrounded by the insulating filler 220. Since the interposer substrate 310 is spaced apart from the upper surface of the first molding layer 140 and the upper surface of the first semiconductor chip 120 by a height of each of the other parts of the first protrusions 320, a distance between the interposer substrate 310 and the upper surface of the first molding layer 140 may be defined by the first protrusions 320 of the interposer 300a. In addition, the upper surface of the first semiconductor chip 120 may be coplanar with the upper surface of the first molding layer 140, and a distance between the upper surface of the first semiconductor chip 120 and the interposer substrate 310 may also be defined by the first protrusions 320 of the interposer 300a.

Figure 5:
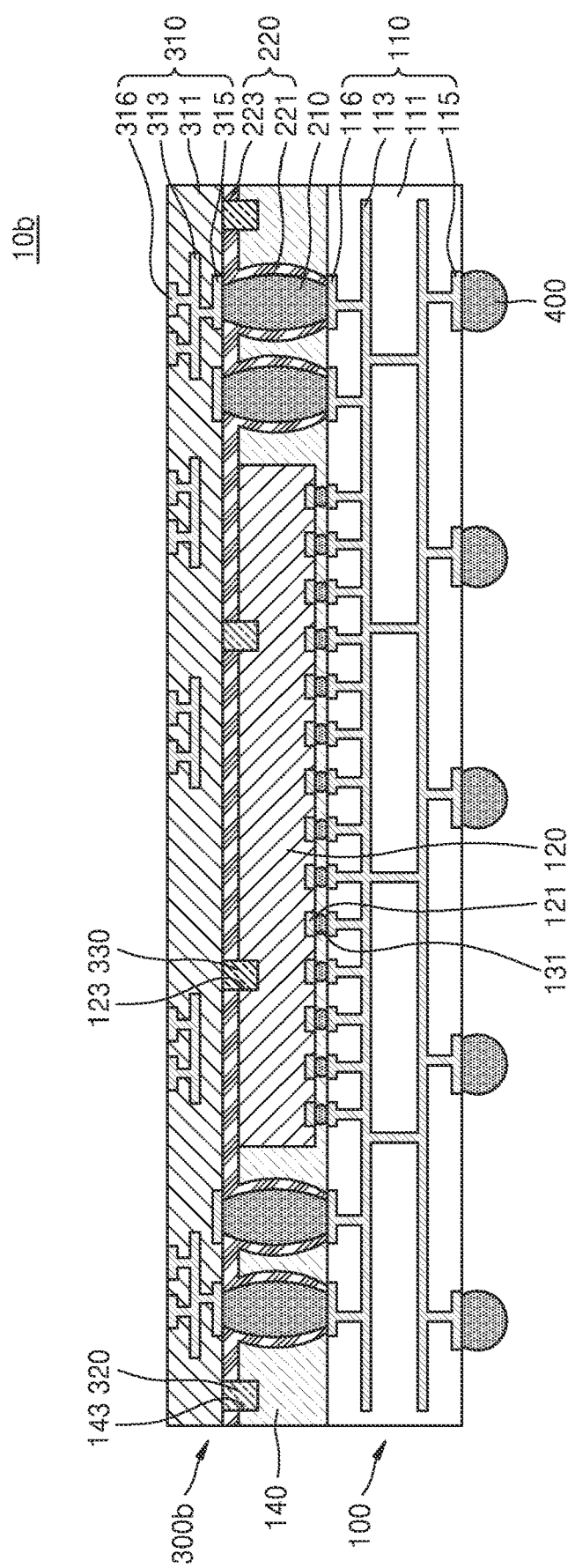
FIG. 5 is a cross-sectional view illustrating a semiconductor package according to example embodiments of the inventive concept.

FIG. 5 is a cross-sectional view illustrating a semiconductor package 10b according to example embodiments of the inventive concept. The semiconductor package 10b illustrated in FIG. 5 may be the same as or similar to the semiconductor package 10a described with reference to FIG. 4 excluding that the interposer 300 further includes second protrusions 330. Hereinafter, for convenience sake, a difference between the semiconductor package 10b illustrated in FIG. 5 and the semiconductor package 10a described with reference to FIG. 4 will be mainly described.

Referring to FIG. 5, the semiconductor package 10b may include the first package 100, an interposer 300b, the conductive connectors 210, and the insulating filler 220 and the first package 100 may include the first package substrate 110, the first semiconductor chip 120, and the first molding layer 140.

The first semiconductor chip 120 may include second trenches 123 provided in an upper side toward the interposer 300b and the interposer 300b may include the second protrusions 330 inserted into the second trenches 123 of the first semiconductor chip 120. For example, the second protrusions 330 of the interposer 300b may be columnar to protrude from the lower surface of the interposer substrate 310 and each of the second trenches 123 of the first semiconductor chip 120 may have a shape corresponding to that of each of the second protrusions 330 to accommodate each of the second protrusions 330.

In example embodiments, the first semiconductor chip 120 may include a plurality of second trenches 123 and the interposer 300b may include a plurality of second protrusions 330 inserted into the plurality of second trenches 123. For example, the plurality of second trenches 123 may be symmetrically arranged based on the center of the first semiconductor chip 120 and the plurality of first protrusions 320 may be arranged to correspond to the arrangement of the plurality of first trenches 143.

As the second protrusions 330 of the interposer 300b are inserted into the second trenches 123 of the first semiconductor chip 120, the interposer 300b may be firmly fixed onto the first package 100. In addition, since the interposer 300b and the first package 100 are aligned when the second protrusions 330 of the interposer 300b are inserted into the second trenches 123 of the first semiconductor chip 120, when the interposer 300b is assembled with the first package 100, misalignment between the interposer 300b and the first package 100 may be prevented.

In example embodiments, the second protrusions 330 of the interposer 300b may support the interposer substrate 310 so that the interposer substrate 310 is spaced apart from the upper surface of the first molding layer 140 and the upper surface of the first semiconductor chip 120. In more detail, a height of each of the second protrusions 330 of the interposer 300b may be greater than a depth of each of the second trenches 123 of the first semiconductor chip 120. In this case, only parts of the second protrusions 330 may be inserted into the second trenches 123 and the other parts of the second protrusions 330 may be positioned above the upper surface of the first semiconductor chip 120 and may be surrounded by the insulating filler 220. Since the interposer substrate 310 is spaced apart from the upper surface of the first molding layer 140 and the upper surface of the first semiconductor chip 120 by a height of each of the other parts of the second protrusions 330, a distance between the interposer substrate 310 and the upper surface of the first semiconductor chip 120 may be defined by the second protrusions 330 of the interposer 300b. In addition, the first molding layer 140 may be coplanar with the upper surface of the first semiconductor chip 120, and a distance between the upper surface of the first molding layer 140 and the interposer substrate 310 may also be defined by the second protrusions 330 of the interposer 300b.

In example embodiments, the second protrusions 330 of the interposer 300b may support the interposer substrate 310 so that the interposer substrate 310 is spaced apart from the upper surface of the first molding layer 140 and the upper surface of the first semiconductor chip 120 in cooperation with the first protrusions 320 of the interposer 300b and may define a distance between the interposer substrate 310 and the first molding layer 140 and a distance between the interposer substrate 310 and the first semiconductor chip 120.

Figure 6:
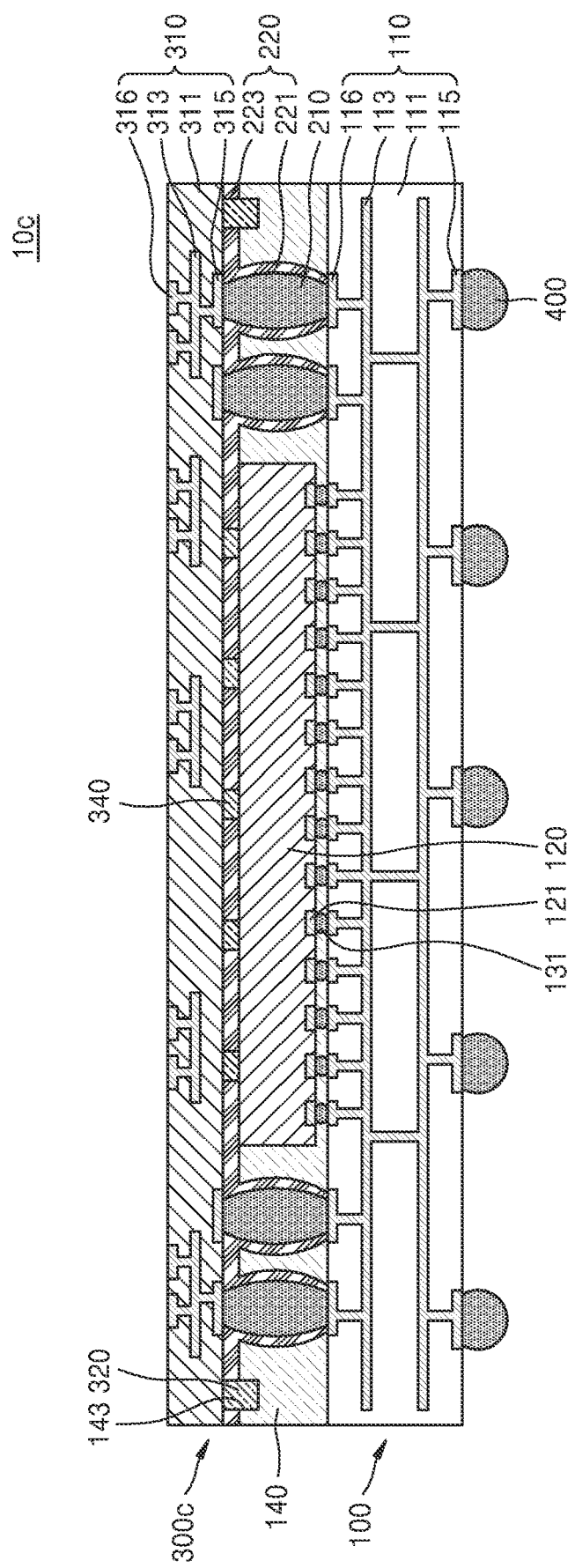
FIG. 6 is a cross-sectional view illustrating a semiconductor package according to example embodiments of the inventive concept.

FIG. 6 is a cross-sectional view illustrating a semiconductor package 10c according to example embodiments of the inventive concept. The semiconductor package 10c illustrated in FIG. 6 may be the same as or similar to the semiconductor package 10a described with reference to FIG. 4 excluding that an interposer 300c further includes spacers 340. Hereinafter, for convenience sake, a difference between the semiconductor package 10c illustrated in FIG. 6 and the semiconductor package 10a described with reference to FIG. 4 will be mainly described.

Referring to FIG. 6, the semiconductor package 10c may include the first package 100, the interposer 300c, the conductive connectors 210, and the insulating filler 220 and the first package 100 may include the first package substrate 110, the first semiconductor chip 120, and the first molding layer 140.

The interposer 300c may include the spacers 340 that contact the upper surface of the first semiconductor chip 120. The spacers 340 may be columnar to protrude from the lower surface of the interposer substrate 310. In example embodiments, the interposer 300c may include a plurality of spacers 340 having the same height. A lower surface of each of the plurality of spacers 340 contact the upper surface of the first semiconductor chip 120 and side walls of each of the plurality of spacers 340 may be surrounded by the insulating filler 220.

The spacers 340 of the interposer 300c may define the distance between the upper surface of the first semiconductor chip 120 and the interposer substrate 310 and may define the distance between the upper surface of the first molding layer 140 on the same plane as the upper surface of the first semiconductor chip 120 and the interposer substrate 310. That is, the spacers 340 of the interposer 300c may support the interposer substrate 310 so that the interposer substrate 310 is spaced apart from the upper surface of the first semiconductor chip 120 by a uniform distance.

In example embodiments, the spacers 340 of the interposer 300c may support the interposer substrate 310 so that the interposer substrate 310 is spaced apart from the upper surface of the first molding layer 140 and the upper surface of the first semiconductor chip 120 in cooperation with the first protrusions 320 of the interposer 300c and may define the distance between the interposer substrate 310 and the first molding layer 140 and the distance between the interposer substrate 310 and the first semiconductor chip 120.

Furthermore, when the interposer 300c further includes the second protrusions 330 described with reference to FIG. 5, the spacers 340 of the interposer 300c, the first protrusions 320, and the second protrusions 330 may support the interposer substrate 310 so that the interposer substrate 310 is spaced apart from the upper surface of the first molding layer 140 and the upper surface of the first semiconductor chip 120 in cooperation with each other and may define the distance between the interposer substrate 310 and the first molding layer 140 and the distance between the interposer substrate 310 and the first semiconductor chip 120.

Figure 7:
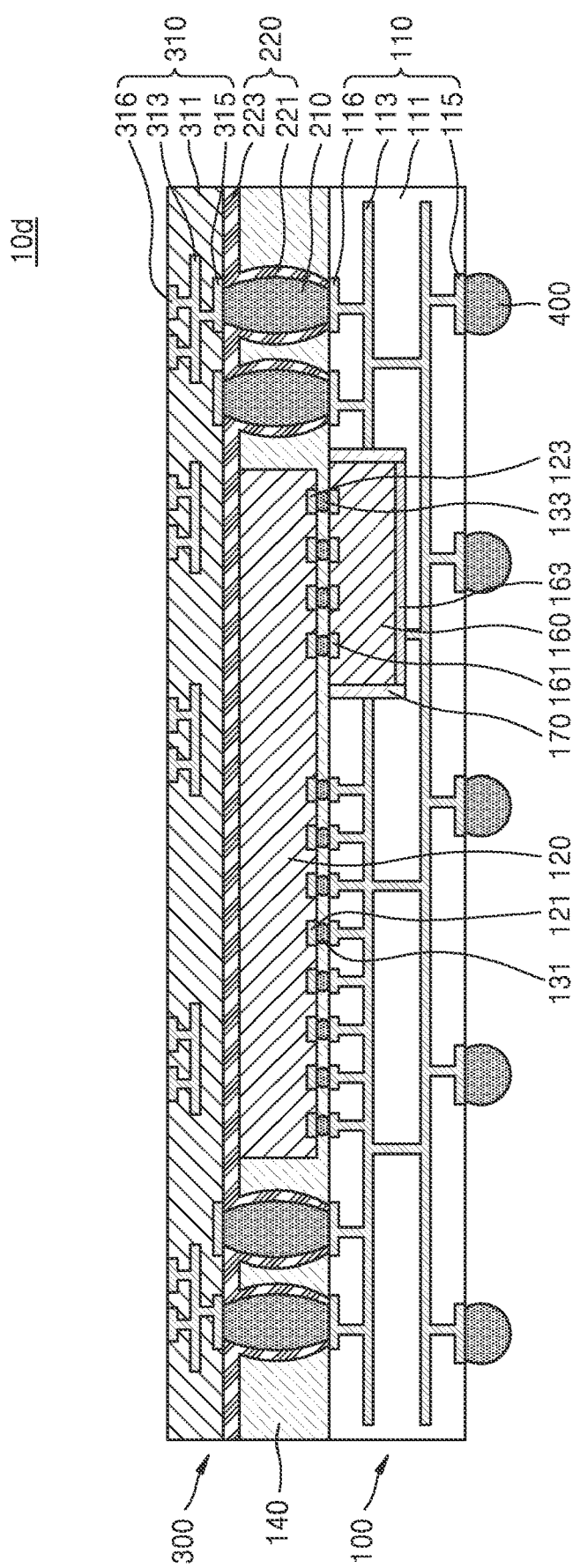
FIG. 7 is a cross-sectional view illustrating a semiconductor package according to example embodiments of the inventive concept.

FIG. 7 is a cross-sectional view illustrating a semiconductor package 10d according to example embodiments of the inventive concept. The semiconductor package 10d illustrated in FIG. 7 may be the same as or similar to the semiconductor package 10 described with reference to FIG. 1 excluding that the semiconductor package 10d illustrated in FIG. 7 further includes an embedded semiconductor device 160. Hereinafter, for convenience sake, a difference between the semiconductor package 10d illustrated in FIG. 7 and the semiconductor package 10 described with reference to FIG. 1 will be mainly described.

Referring to FIG. 7, the semiconductor package 10d may further includes the embedded semiconductor device 160 embedded in the first package substrate 110. For example, the embedded semiconductor device 160 may be accommodated in a recess portion of the first package substrate 110. The embedded semiconductor device 160 may be attached onto a bottom surface of the recess portion by an adhesive film 163. An embedded insulating layer 170 that covers at least a part of the embedded semiconductor device 160 may be provided in the recess portion of the first package substrate 110.

The embedded semiconductor device 160 may be electrically connected to the first semiconductor chip 120. For example, the embedded semiconductor device 160 may be accommodated in the recess portion of the first package substrate 110 so that one surface on which pads 161 are provided faces the first semiconductor chip 120. Connection terminals 133 may be arranged between the pads 161 of the embedded semiconductor device 160 and the first chip pads 121 of the first semiconductor chip 120. The embedded semiconductor device 160 may be electrically connected to the first semiconductor chip 120 through the connection terminals 133.

In example embodiments, the embedded semiconductor device 160 may be a memory chip, a logic chip, an active element, or a passive element. In example embodiments, the embedded semiconductor device 160 may be a different kind of semiconductor chip from the first semiconductor chip 120. For example, when the first semiconductor chip 120 is the logic chip such as an application processor (AP), the embedded semiconductor device 160 may be the memory chip.

Figure 8:
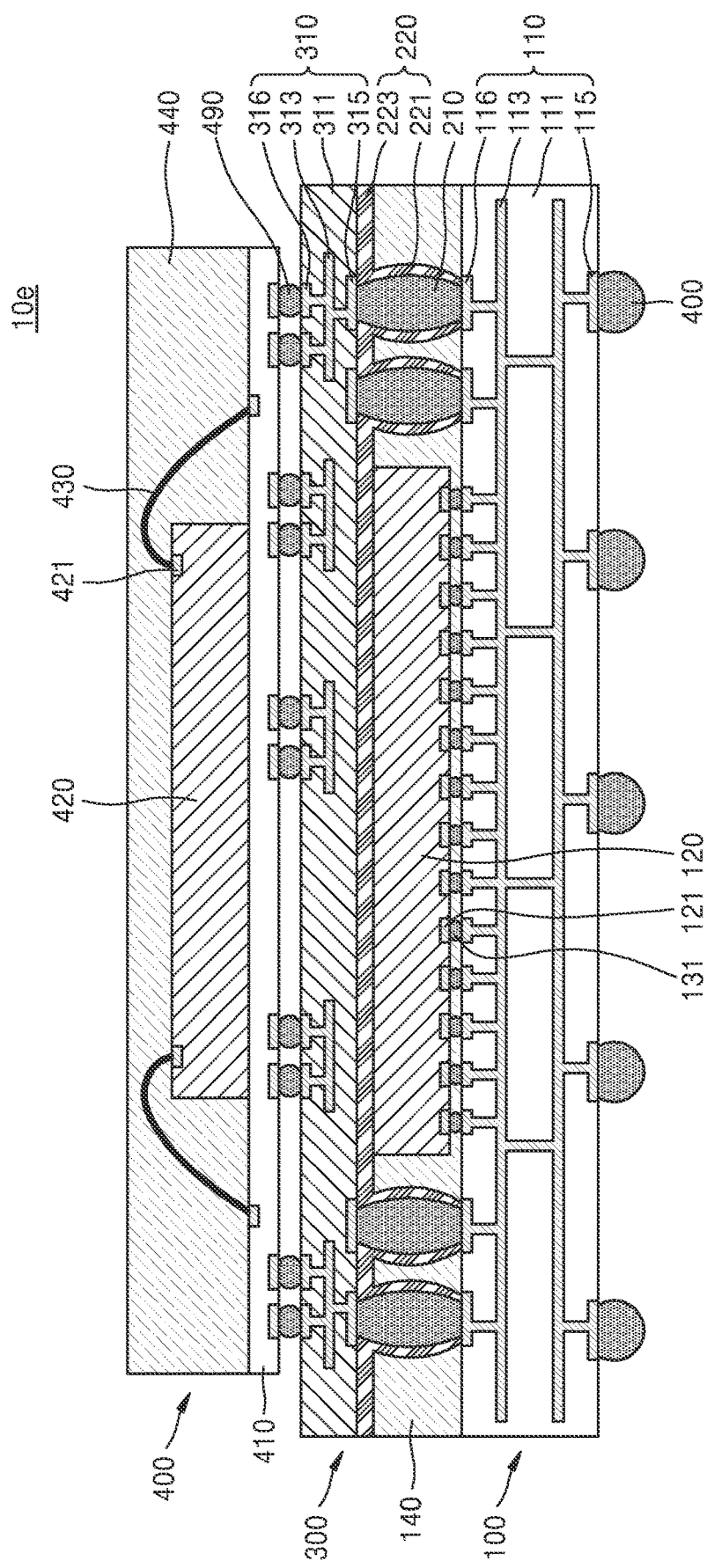
FIG. 8 is a cross-sectional view illustrating a semiconductor package according to example embodiments of the inventive concept.

FIG. 8 is a cross-sectional view illustrating a semiconductor package 10e according to example embodiments of the inventive concept. The semiconductor package 10e illustrated in FIG. 8 may be the same as or similar to the semiconductor package 10 described with reference to FIG. 1 excluding that the semiconductor package 10e illustrated in FIG. 8 further includes a second package 400. Hereinafter, for convenience sake, a difference between the semiconductor package 10e illustrated in FIG. 8 and the semiconductor package 10 described with reference to FIG. 1 will be mainly described.

Referring to FIG. 8, the semiconductor package 10e may further include the first package 100, the interposer 300 stacked on the first package 100, and the second package 400 stacked on the interposer 300. The semiconductor package 10 may be a package on package type semiconductor package in which the first package 100 and the second package 400 respectively form a lower package and an upper package.

The second package 400 may include a second package substrate 410, a second semiconductor chip 420 on the second package substrate 410, and a second molding layer 440 that covers at least a part of the second semiconductor chip 420.

The second package substrate 410 may be, for example, the PCB. The second package substrate 410 may include upper pads and lower pads respectively formed on an upper surface of the second package substrate 410 and a lower surface of the second package substrate 410. The second package substrate 410 may be electrically connected to the interposer 300 through connection terminals 490 interposed between the lower pads of the second package substrate 410 and the interposer upper pads 316 of the interposer 300.

The second semiconductor chip 420 may be mounted on the second package substrate 410 by, for example, a face-up manner. In this case, second chip pads 421 of the second semiconductor chip 420 may be electrically connected to the upper pads of the second package substrate 410 through conductive wires 430. The inventive concept is not limited thereto and the second semiconductor chip 420 may be mounted on the second package substrate 410 by a flip chip manner. The second semiconductor chip 420 may be electrically connected to the first semiconductor chip 120 or an external connection terminal 400 through the interposer 300.

In example embodiments, the first semiconductor chip 120 may be a different kind of semiconductor chip from the second semiconductor chip 420. For example, when the first semiconductor chip 120 is the logic chip, the second semiconductor chip 420 may be the memory chip. In example embodiments, the semiconductor package 10 may be a system in package in which different kinds of semiconductor chips are electrically connected and operate as one system. Alternatively, in other example embodiments, the first semiconductor chip 120 may be the same kind of semiconductor chip as the second semiconductor chip 420.

FIGS. 9A to 9G are cross-sectional views illustrating a method of manufacturing a semiconductor package according to example embodiments of the inventive concept. Hereinafter, a method of manufacturing the semiconductor package 10c illustrated in FIG. 6 will be described with reference to FIGS. 9A to 9G.

Figure 9A:
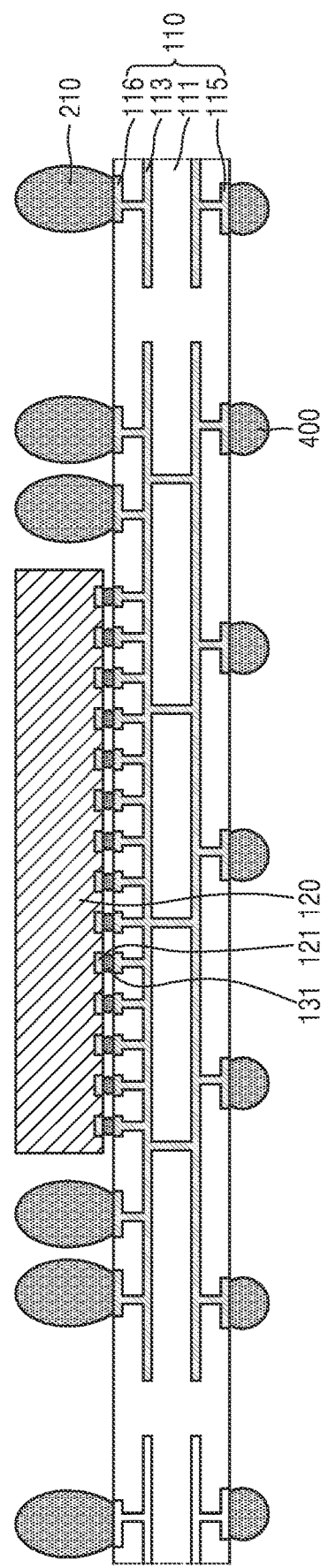
FIGS. 9A to 9G are cross-sectional views illustrating a method of manufacturing a semiconductor package according to example embodiments of the inventive concept.

Referring to FIG. 9A, the first semiconductor chip 120 is mounted on the first package substrate 110. The first semiconductor chip 120 may be attached onto the first package substrate 110 so that the first chip pads 121 face the upper surface of the first package substrate 110. The first chip pads 121 of the first semiconductor chip 120 may be electrically connected to the upper pads 116 of the first package substrate 110 through the chip connection terminals 131.

In example embodiments, the first package substrate 110 may have a PCB strip structure in which a plurality of PCBs are connected to each other and a plurality of first semiconductor chips 120 may be mounted on the first package substrate 110.

After the first semiconductor chip 120 is mounted on the first package substrate 110, the conductive connectors 210 are formed on the first package substrate 110. The conductive connectors 210 are spaced apart from the side walls of the first semiconductor chip 120 in the horizontal direction and may be formed on the upper pads 116 of the first package substrate 110. The conductive connectors 210 may be, for example, solder balls, solder bumps, or conductive posts.

Figure 9B:
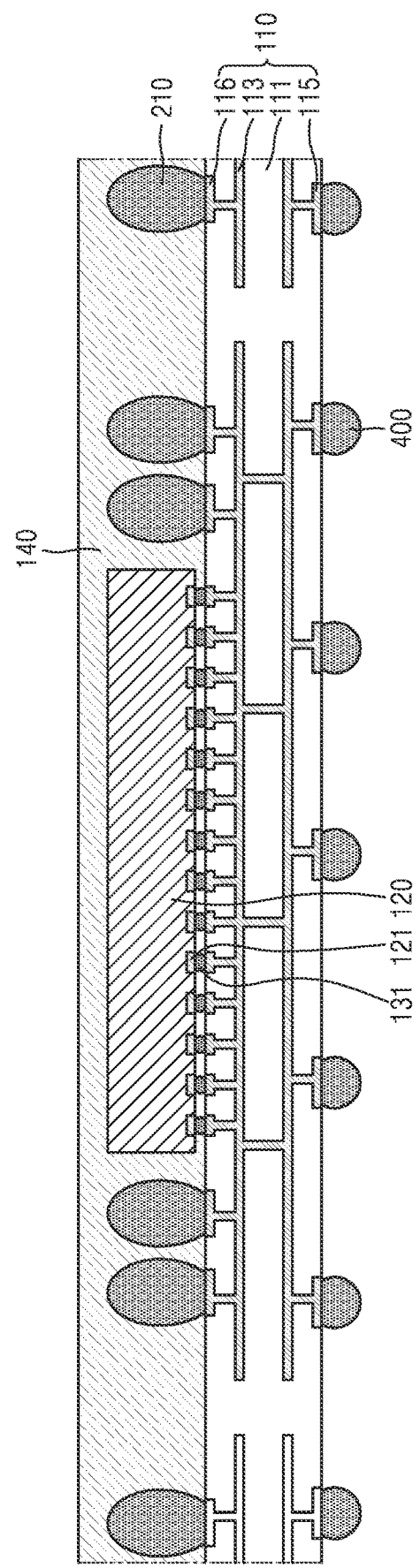

Referring to FIG. 9B, the first molding layer 140 for molding the first semiconductor chip 120 is formed. The first molding layer 140 may be formed on the upper surface of the first package substrate 110 so as to cover the first semiconductor chip 120 and the conductive connectors 210. For example, the first molding layer 140 is formed through a molded under-fill process and may fill the gap between the first semiconductor chip 120 and the first package substrate 110.

Figure 9C:
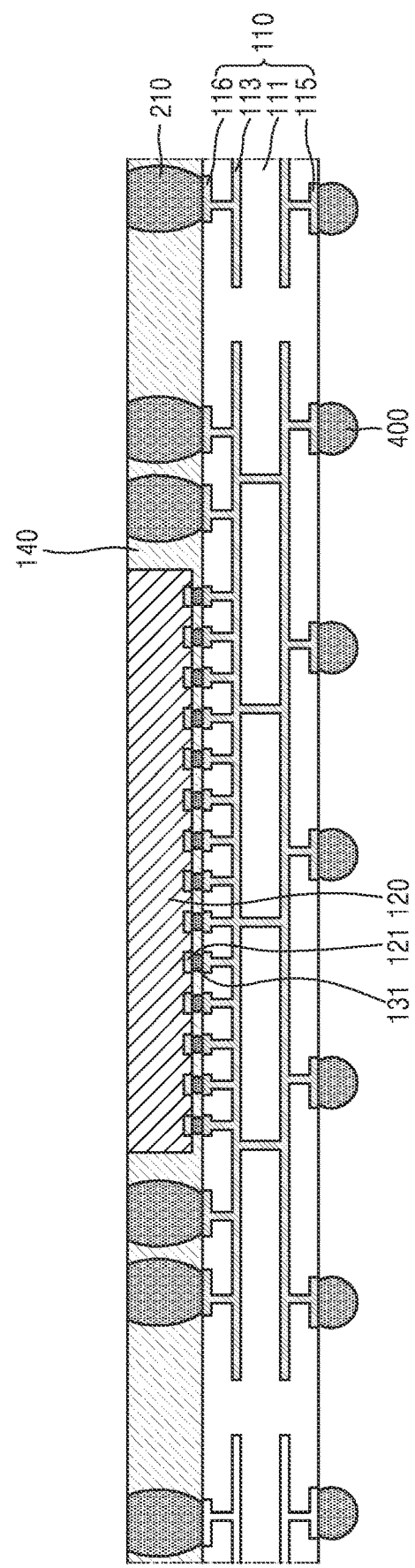

Referring to FIG. 9C, until the first semiconductor chip 120 and the conductive connectors 210 are exposed, a process of polishing the resultant material of FIG. 9B is performed. By the polishing process, a part of the first molding layer 140, a part of the first semiconductor chip 120, and parts of the conductive connectors 210 may be removed. As a result of performing the polishing process, the upper surface of the first semiconductor chip 120, the upper surface of the first molding layer 140, and upper surfaces of the conductive connectors 210 may be planarized (or flattened). The upper surface of the first semiconductor chip 120, the upper surface of the first molding layer 140, and the upper surfaces of the conductive connectors 210 may be provided on the same plane. For example, the polishing process may be a grinding process performed by using a diamond wheel, an etch-back process, or a chemical mechanical polishing process.

In example embodiments, a part of the first semiconductor chip 120 may be removed by the polishing process so that a thickness of the first semiconductor chip 120 may be reduced.

Figure 9D:
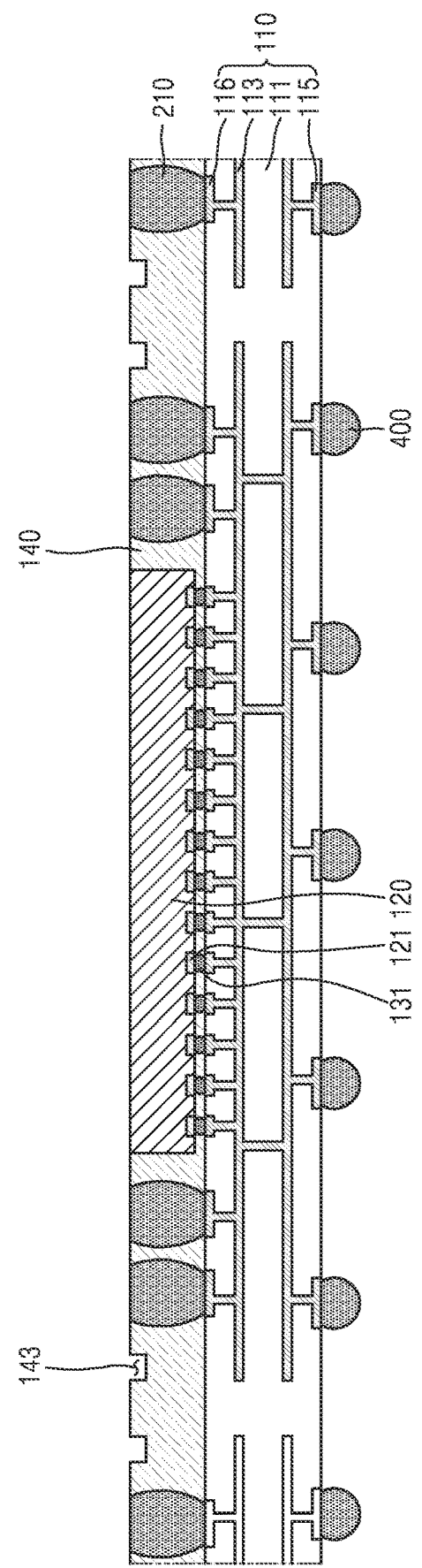

Referring to FIG. 9D, after performing the polishing process, the first trenches 143 may be formed by removing a part of the first molding layer 140. The first trenches 143 may be formed by, for example, a laser drilling process or an etching process.

Figure 9E:
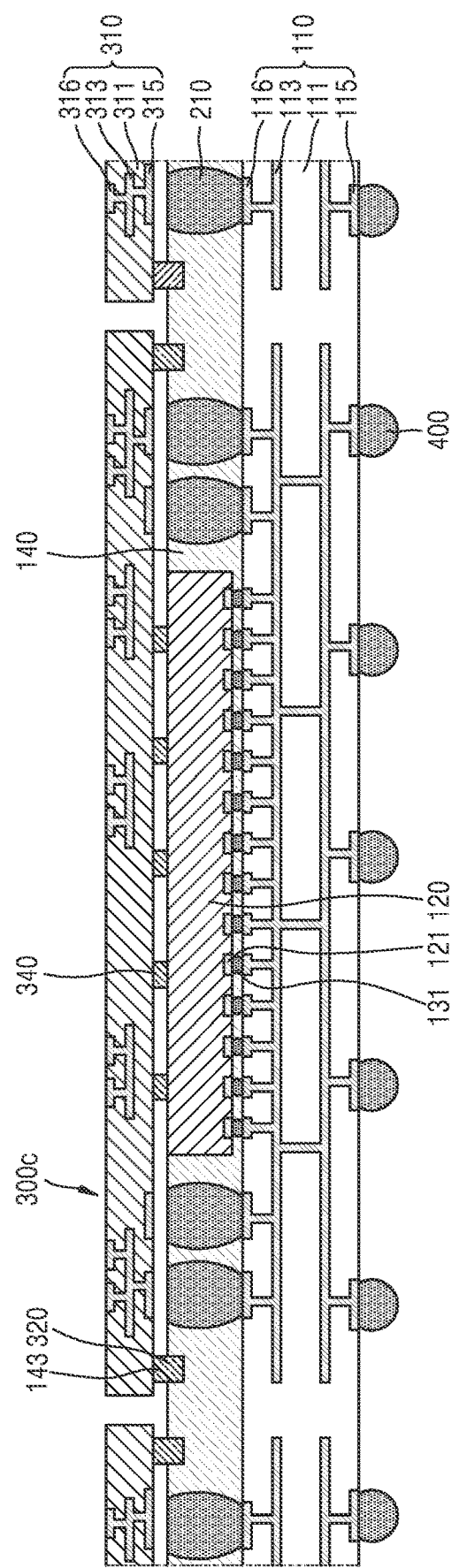

Referring to FIG. 9E, after forming the first trenches 143, the interposer 300 is arranged on the first molding layer 140 and the first semiconductor chip 120. As the first protrusions 320 of the interposer 300 are inserted into the first trenches 143 of the first molding layer 140, the interposer 300 may be aligned on the first molding layer 140. When the interposer 300 is arranged on the first molding layer 140, by the first protrusions 320 and the spacers 340 of the interposer 300, the interposer substrate 310 may be spaced apart from the upper surface of the first molding layer 140 by a uniform distance.

In example embodiments, when the first package substrate 110 has the PCB strip structure, a plurality of interposers 300 may be arranged on the plurality of first semiconductor chips 120 on the first package substrate 110.

Figure 9F:
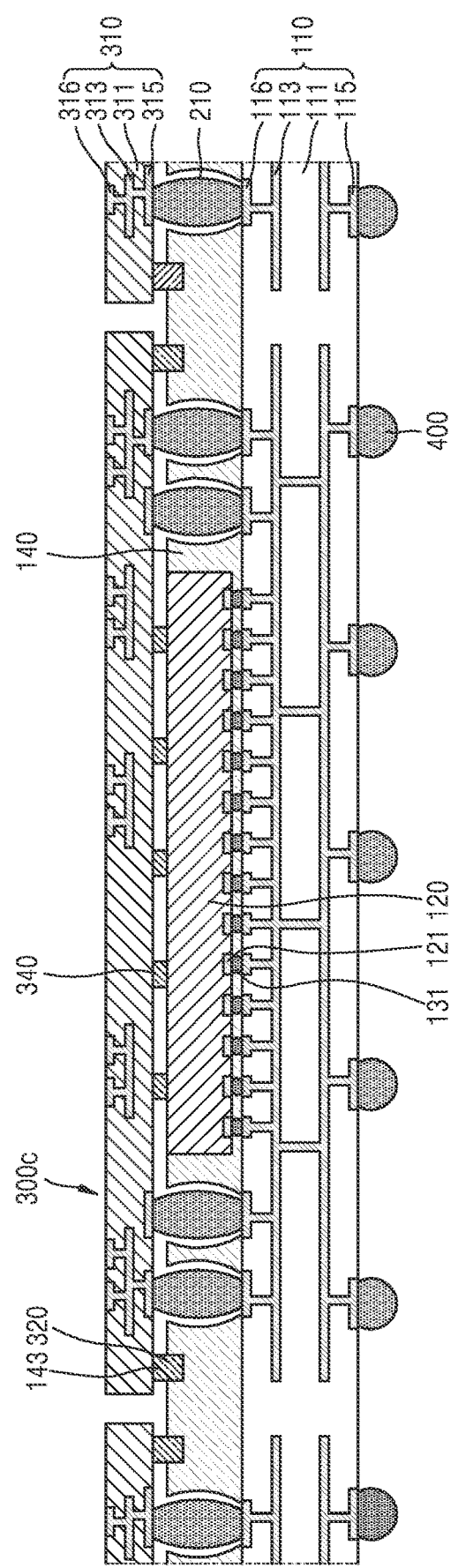

Referring to FIG. 9F, after the interposer 300 is arranged on the first molding layer 140 and the first semiconductor chip 120, a reflow process is performed so that the conductive connectors 210 are attached to the interposer lower pads 315 of the interposer substrate 310. During the reflow process, a material that forms the conductive connectors 210 is melted in a liquid state and then hardened. When the material that forms the conductive connectors 210 melted into the liquid state, an upper portion of the material transformed to be convex due to surface tension and may be attached to the interposer lower pads 315 formed of a metal. Then, the material that forms the conductive connectors 210 may be hardened in a state of being attached to the interposer lower pads 315. In the hardening process of the conductive connectors 210, the conductive connectors 210 are extended to be attached to the lower pads 115 and a volume of the conductive connectors 210 is partially reduced while the conductive connectors 210 are changed from the liquid to a solid. Accordingly, a gap may be formed between the side walls of the conductive connectors 210 and the inner wall of the first molding layer 140.

Figure 9G:
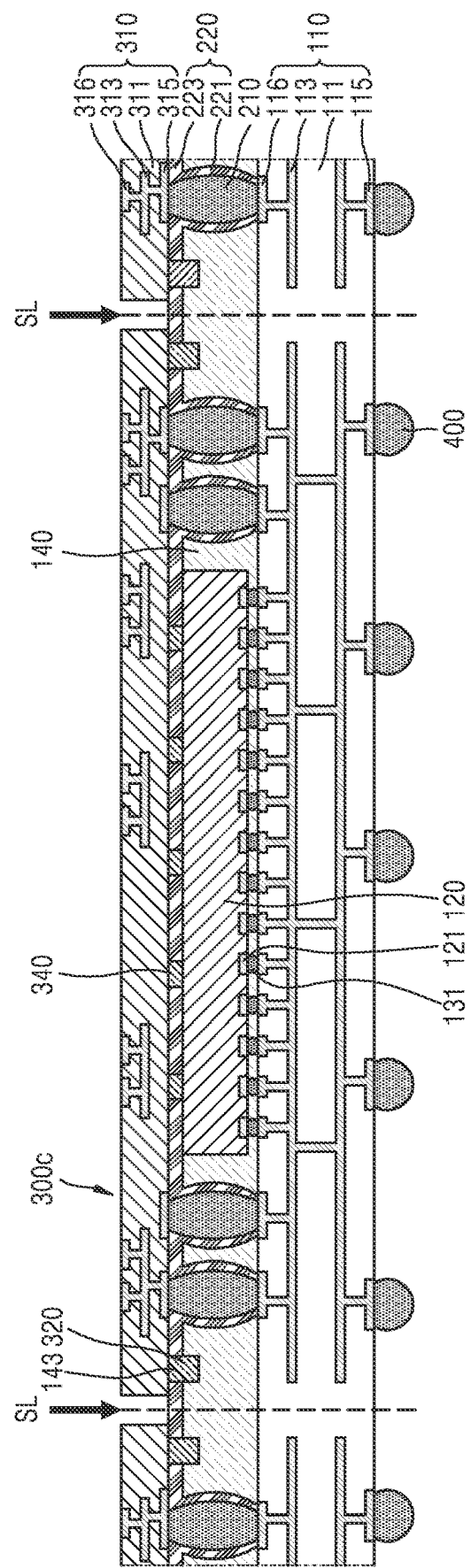

Referring to FIG. 9G, after performing the reflow process, the insulating filter 220 is formed. The insulating filler 220 may fill a gap between the interposer 300 and the first molding layer 140 and a gap between the interposer 300 and the first semiconductor chip 120. The plurality of interposers 300 may be attached onto the package substrate 110 through the insulating filler 220.

In addition, the insulating filler 220 may fill a gap between the side walls of the conductive connectors 210 and the inner wall of the first molding layer 140.

In example embodiments, in order to form the insulating filler 220, an insulating filling material may be injected through a gap between adjacent interposers 300. For example, the insulating filling material may be injected by using a nozzle. The insulating filling material may flow to the gap between the interposer 300 and the first molding layer 140, the gap between the interposer 300 and the first semiconductor chip 120, and the gap between the side walls of the conductive connectors 210 and the inner wall of the first molding layer 140 by capillary action. As the insulating filling material is hardened, the insulating filler 220 that fills the gap between the interposer 300 and the first molding layer 140, the gap between the interposer 300 and the first semiconductor chip 120, and the gap between the side walls of the conductive connectors 210 and the inner wall of the first molding layer 140 may be formed.

In other example embodiments, the insulating filler 220 may be formed of a non-conductive film. In more detail, in the insulating filler 220, as described with reference to FIG. 9E, when the interposer 300 is arranged on the first molding layer 140 and the first semiconductor chip 120, the non-conductive film may be arranged on the lower surface of the interposer 300. Then, when a thermo-compression process is performed on the non-conductive film, a material that forms the non-conductive film may flow to fill the gap between the interposer 300 and the first molding layer 140, the gap between the interposer 300 and the first semiconductor chip 120, and the gap between the side walls of the conductive connectors 210 and the inner wall of the first molding layer 140.

After forming the insulating filler 220, a singulation process of cutting off the resultant material illustrated in FIG. 9G along the scribe lane SL by using a sawing blade is performed so that the individualized semiconductor package 10c may be completed as illustrated in FIG. 6.

In a general semiconductor package, when connectors for connecting a package substrate to an interposer are formed, a laser drilling process for exposing the connectors covered with a molding layer is performed. While the laser drilling process is performed, a problem in which an oxide is formed on surfaces of the connectors or a foreign substance resides around the connectors frequently occurs. However, in the example embodiments according to the inventive concept, since the conductive connectors 210 covered with the first molding layer 140 may be exposed by the polishing process such as the grinding process, the laser drilling process for exposing the conductive connectors 210 may be omitted. Since the laser drilling process is omitted, adhesion reliability between the first package substrate 110 and the interposer 300 using the conductive connectors 210 may improve, manufacturing processes of the semiconductor package 10 may be simplified, and manufacturing expenses of the semiconductor package 10 may be reduced.

In addition, in the example embodiments according to the inventive concept, since the thickness of the first semiconductor chip 120 may be reduced during the polishing process for exposing the conductive connectors 210, the light, thin, and simplified semiconductor package 10c may be provided.

While the inventive concept has been particularly shown and described with reference to embodiments thereof, it will be understood that various changes in form and details may be made therein without departing from the scope of the following claims.

What is claimed is:

1. A semiconductor package comprising:
a first package substrate;
a first semiconductor chip on the first package substrate;
a molding layer covering side walls of the first semiconductor chip and including through holes, wherein an upper surface of the molding layer is coplanar with an upper surface of the first semiconductor chip;
an interposer on the first semiconductor chip and the molding layer;
conductive connectors in the through holes of the molding layer and connected to the first package substrate and the interposer; and
an insulating filler comprising a first portion that fills the through holes of the molding layer so as to surround side walls of the conductive connectors.

2. The semiconductor package of claim 1, wherein the insulating filler further comprises a second portion between the first semiconductor chip and the interposer and between the molding layer and the interposer.

3. The semiconductor package of claim 1, wherein the conductive connectors are spaced apart from an inner wall of the molding layer with the first portion of the insulating filler interposed between the conductive connectors and the inner wall of the molding layer.

4. The semiconductor package of claim 1, wherein the interposer comprises interposer lower pads connected to the conductive connectors, and
wherein at least parts of the interposer lower pads protrude from a lower surface of the interposer.

5. The semiconductor package of claim 1, wherein the molding layer comprises first trenches, and
wherein the interposer comprises first protrusions in the first trenches of the molding layer.

6. The semiconductor package of claim 1, wherein the first semiconductor chip comprises second trenches, and
wherein the interposer comprises second protrusions in the second trenches of the first semiconductor chip.

7. The semiconductor package of claim 1, wherein the interposer comprises an interposer substrate and spacers provided on a lower surface of the interposer substrate,
wherein the spacers contact the upper surface of the first semiconductor chip and maintain the interposer substrate in spaced apart relationship with the first semiconductor chip by a uniform distance, and
wherein side walls of each of the spacers are surrounded by the insulating filler.

8. The semiconductor package of claim 1, further comprising an embedded semiconductor device embedded in the first package substrate and electrically connected to the first semiconductor chip.

9. The semiconductor package of claim 1, further comprising:
a second package substrate on the interposer; and
a second semiconductor chip on the second package substrate.

10. A semiconductor package comprising:
a package substrate;
a semiconductor chip on the package substrate;
a molding layer covering side walls of the semiconductor chip and including first trenches;
an interposer on the semiconductor chip and the molding layer, the interposer comprising an interposer substrate and first protrusions protruding from a lower surface of the interposer substrate, the first protrusions extending into the first trenches of the molding layer; and
conductive connectors penetrating through the molding layer and connected to the package substrate and the interposer.

11. The semiconductor package of claim 10, wherein the first protrusions support the interposer substrate so that the interposer substrate is spaced apart from an upper surface of the molding layer and an upper surface of the semiconductor chip.

12. The semiconductor package of claim 11, wherein the interposer further comprises second protrusions protruding from the lower surface of the interposer substrate and extending into second trenches of the semiconductor chip, and
wherein the second protrusions support the interposer substrate so that the interposer substrate is spaced apart from the upper surface of the molding layer and the upper surface of the semiconductor chip in cooperation with the first protrusions.

13. The semiconductor package of claim 11, wherein the interposer further comprises spacers on the lower surface of the interposer substrate, wherein the spacers contact the upper surface of the semiconductor chip, and
wherein the spacers support the interposer substrate so that the interposer substrate is spaced apart from the upper surface of the molding layer and the upper surface of the semiconductor chip by a uniform distance.

14. The semiconductor package of claim 10, further comprising an insulating filler,
wherein the insulating filler comprises:
a first portion in through holes of the molding layer so as to surround side walls of the conductive connectors; and
a second portion between an upper surface of the semiconductor chip and the lower surface of the interposer substrate and between an upper surface of the molding layer and a lower surface of the interposer substrate.

15. The semiconductor package of claim 10, wherein the first protrusions contact the molding layer.

16. A semiconductor package comprising:
a first package including a first package substrate, a first semiconductor chip on the first package substrate, and a molding layer covering side walls of the first semiconductor chip;
an interposer on the first package;
conductive connectors in through holes of the molding layer and electrically connecting the interposer to the first package substrate;
an insulating filler filling a gap between the interposer and the first package substrate and filling the through holes of the molding layer so as to surround side walls of the conductive connectors; and
a second package on the interposer and including a second package substrate and a second semiconductor chip on the second package substrate,
wherein an upper surface of the molding layer is coplanar with an upper surface of the first semiconductor chip.

17. The semiconductor package of claim 16, wherein, with respect to a first direction from a lower surface of the molding layer toward an upper surface of the molding layer, widths of lower portions of the through holes of the molding layer gradually increase along the first direction and widths of upper portions of the through holes of the molding layer gradually reduce along the first direction.

18. The semiconductor package of claim 17, wherein widths of lower portions of the conductive connectors gradually increase along the first direction and widths of upper portions of the conductive connectors gradually reduce along the first direction.

19. The semiconductor package of claim 16, wherein the molding layer comprises an epoxy molding compound, and
wherein the insulating filler comprises a material different from that of the molding layer.

20. The semiconductor package of claim 16, wherein the interposer comprises an interposer substrate and first protrusions on a lower surface of the interposer substrate,
wherein the molding layer comprises first trenches into which the first protrusions extend, and
wherein a depth of each of the first trenches is less than a height of each of the first protrusions.

* * * * *